(12) United States Patent
Jin et al.

(10) Patent No.: US 6,479,100 B2
(45) Date of Patent: *Nov. 12, 2002

(54) CVD RUTHENIUM SEED FOR CVD RUTHENIUM DEPOSITION

(75) Inventors: Xiaoliang Jin, San Jose; Christopher P. Wade, Los Gatos; Xianzhi Tao, Palo Alto; Elaine Pao, Los Altos Hills; Yaxin Wang, Fremont; Jun Zhao, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 52 days.

This patent is subject to a terminal disclaimer.

(21) Appl. No.: 09/827,878

(22) Filed: Apr. 5, 2001

(65) Prior Publication Data

US 2002/0146513 A1 Oct. 10, 2002

(51) Int. Cl.$^7$ ............................................... C23C 16/40
(52) U.S. Cl. .............................. 427/255.31; 427/255.7; 427/99; 427/126.5; 427/376.2
(58) Field of Search ............................ 427/255.7, 250, 427/255.31, 99, 124, 126.5, 376.2; 438/240, 253

(56) References Cited

U.S. PATENT DOCUMENTS

| | | | | |
|---|---|---|---|---|
| 5,383,088 A | * | 1/1995 | Chapple-Sokol et al. | 427/126.3 |
| 5,618,761 A | * | 4/1997 | Eguchi et al. | 427/126.3 |
| 5,834,357 A | * | 11/1998 | Kang | 438/396 |
| 6,063,705 A | * | 5/2000 | Vaartstra | 427/255.31 |
| 6,238,966 B1 | * | 5/2001 | Ueda et al. | 438/240 |

OTHER PUBLICATIONS

Aoyama, Tomonori et al., "Rithenium Films Prepared by Liquid Source Chemical Vapor Deposition Using Bis–(ethylcyclopentadienyl)ruthenium," Japanese Journal of Applied Physics, vol.38, Pt. 2, No. 10A, pp. 11334–1136, 1999.*

* cited by examiner

Primary Examiner—Bret Chen
(74) Attorney, Agent, or Firm—Adler & Associates

(57) ABSTRACT

The present invention provides a method of forming a ruthenium seed layer on a substrate comprising the steps of introducing a ruthenium-containing compound into a CVD apparatus; introducing oxygen into the CVD apparatus; maintaining an oxygen rich environment in the process chamber for the initial formation of a ruthenium oxide seed layer; vaporizing the ruthenium-containing compound; depositing the ruthenium oxide seed layer onto the substrate by chemical vapor deposition; and annealing the deposited ruthenium oxide seed layer in a gas ambient forming a ruthenium seed layer. Also provided is a method of depositing a ruthenium thin metal film using a metalorganic precursor onto a CVD ruthenium seed layer by metalorganic chemical vapor deposition.

53 Claims, 9 Drawing Sheets

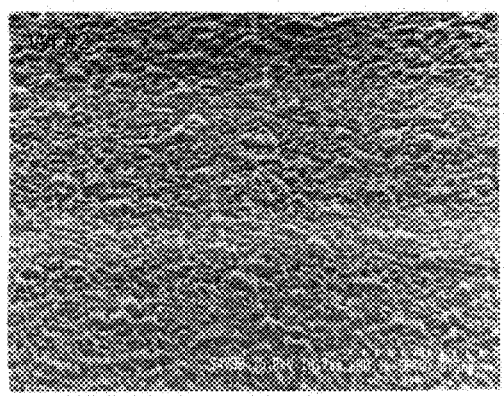 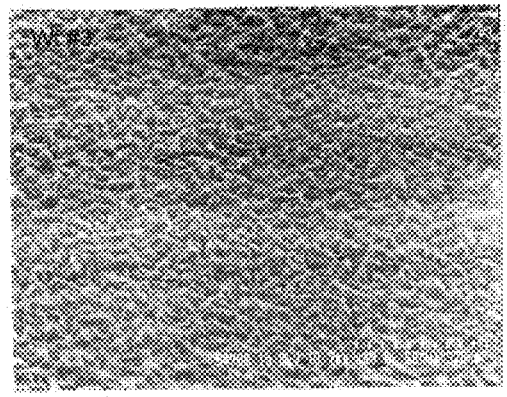
Fig. 6A                    Fig. 6B

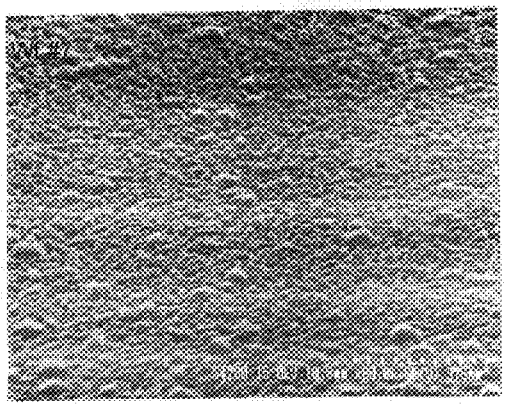 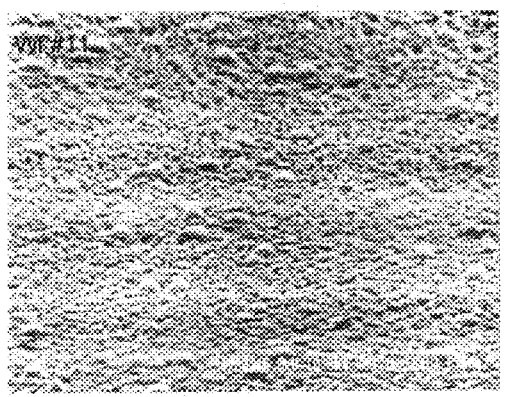
Fig. 9A                    Fig. 9B

CVD RUTHENIUM SEED FOR CVD RUTHENIUM DEPOSITION

BACKGROUND OF THE INVENTION

1. Field of the Invention

The present invention relates generally to the fields of applied physics and chemical vapor deposition of thin metal films. More specifically, the present invention relates to a method of depositing a ruthenium seed layer on a substrate via chemical vapor deposition prior to depositing a ruthenium thin film via metalorganic chemical vapor deposition.

2. Description of the Related Art

In metal-insulator-metal capacitors, ruthenium is a preferred electrode material for capacitor dielectrics. As the next generation technology of VLSI and ULSI structures evolves, it will become necessary to use three-dimensional capacitors despite the metal capacitor dielectrics employed. This requires a thin film on the structures while maintaining a high dielectric constant and small leakage current. It is advantageous to use a chemical vapor deposition process (CVD) to effectively deposit such ruthenium thin films.

Chemical vapor deposition is a broad class of processes using controlled chemical reactions to create layers on wafers and is a key process in the development of ultra-large scale integrated circuit fabrication. Chemical vapor deposition of thin metal films realizes good step coverage and wafer-to-wafer repeatability on complicated topography. Additionally, the use of a metalorganic precursor for CVD ruthenium thin film deposition ensures a higher degree of wafer repeatability. However, for certain substrates, metalorganic CVD (MOCVD) of ruthenium films requires a seed layer.

Currently, ruthenium seed is deposited by physical vapor deposition (PVD) or sputtering. Physical vapor deposition of ruthenium seed is pure ruthenium and very smooth, a preferred characteristic for subsequent ruthenium thin film deposition. However, a PVD ruthenium seed layer is limited by poor step coverage when the critical dimension is small and the aspect ratio is high as is the case in ULSI structures. The benefits inherent in CVD deposition of thin films would accrue to a seed layer deposited in this manner; such CVD ruthenium seed layers would determine the quality of the subsequently deposited CVD ruthenium film, e.g., smoothness, adhesion of the ruthenium thin film and the degree of step coverage and conformality on structures such as MIM structure capacitors.

However, CVD deposition of a metal is not deposition of the pure metal as is the case in a sputtered metal, i.e, the resultant seed layer may contain oxygen. Although the amount of oxygen available during deposition determines the adherence of the seed layer to the substrate, the characteristics of a subsequently deposited thin metal film onto the seed layer are enhanced when the oxygen content of the seed layer is relatively low. This necessitates a CVD ruthenium seed layer being deposited in a manner such that the amount of oxygen available during seeding of the layer and the oxygen content of the end product can be regulated.

The prior art is deficient in the lack of effective means of depositing a ruthenium seed layer by chemical vapor deposition under specific conditions in order to control the characteristics of the seed layer and thereby those of a subsequently deposited ruthenium thin film. The present invention fulfills this long-standing need and desire in the art.

SUMMARY OF THE INVENTION

One embodiment of the present invention provides a method of forming a ruthenium seed layer on a substrate comprising the steps of vaporizing a ruthenium-containing compound; introducing the vaporized ruthenium-containing compound into a CVD apparatus; introducing oxygen into the CVD apparatus; maintaining an oxygen rich environment in a process chamber of the CVD apparatus for the initial formation of a ruthenium oxide seed layer; depositing the ruthenium oxide seed layer onto the substrate by chemical vapor deposition; and annealing the deposited ruthenium oxide seed layer in a gas ambient forming a ruthenium seed layer.

Another embodiment of the present invention provides a method of forming a ruthenium seed layer on a substrate comprising the steps of vaporizing a ruthenium-containing compound at a temperature of about 200° C. to about 400° C.; introducing the vaporized ruthenium-containing compound into a CVD apparatus; introducing oxygen into the CVD apparatus; maintaining an oxygen rich environment in a process chamber of the CVD apparatus for the initial formation of a ruthenium oxide seed layer wherein the oxygen to ruthenium ratio in said environment is from about 1:1 to about 100:1; depositing the ruthenium oxide seed layer onto the substrate by chemical vapor deposition; and annealing the deposited ruthenium oxide seed layer in a gas ambient selected from the group consisting of $H_2/N_2$, $H_2$ and $H_2/Ar$ and wherein said annealing occurs at about 200° C. to about 600° C. thereby forming a ruthenium seed layer.

Another embodiment of the present invention provides a method of forming a ruthenium seed layer on a substrate comprising the steps of vaporizing a ruthenium-containing compound at a temperature of about 200° C. to about 400° C.; introducing the vaporized ruthenium-containing compound into a CVD apparatus; introducing oxygen into the CVD apparatus; maintaining an oxygen rich environment in a process chamber of the CVD apparatus for the initial formation of a ruthenium oxide seed layer wherein the oxygen to ruthenium ratio in said environment is from about 1:1 to about 100:1; depositing the ruthenium oxide seed layer onto the substrate by chemical vapor deposition such that the ruthenium oxide is $RuOx$ wherein x is about 2; and annealing the deposited ruthenium oxide seed layer in a gas ambient selected from the group consisting of $H_2/N_2$, $H_2$ and $H_2/Ar$; wherein said annealing occurs from about 200° C. to about 600° C. wherein the ruthenium is $RuOy$ with y less than 2 thereby forming a ruthenium seed layer.

Another embodiment of the present invention provides a method of forming a ruthenium thin metal film using a metalorganic precursor comprising the steps of forming a ruthenium seed layer on a substrate by the method(s) disclosed above; vaporizing the metalorganic precursor; and depositing the pure ruthenium thin metal film on the ruthenium seed layer by metalorganic chemical vapor deposition.

Other and further aspects, features, and advantages of the present invention will be apparent from the following description of the presently preferred embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate preferred embodiments of the invention and therefore are not to be considered limiting in their scope.

FIG. 2 depicts SEM Images comparing surface morphology of a CVD Ru film deposited on a 50 Å PVD Ru seed layer (FIG. 2A) and on a CVD Ru seed layer with annealing (FIG. 2B) Heater temperature: 360° C. and wafer temperature: 330° C.

FIG. 4 depicts SEM Images comparing CVD Ru films on a thermal oxide (ThOx) substrate with (FIG. 4A) and without (FIG. 4B) a CVD Ru seed layer. Heater temperature: 360° C. and wafer temperature: 330° C. FIG. 5 depicts SEM Images comparing a CVD $RuO_2$ film without a seed layer (FIG. 5A) with a CVD Ru film on CVD Ru seed (FIG. 5B). Heater temperature: 360° C. and wafer temperature: 330° C.

FIG. 6 shows SEM images comparing the effects of annealing the CVD ruthenium seed layer to the substrate prior to deposition of a CVD ruthenium film on the subsequently deposited CVD film (FIG. 6A) with that of a CVD ruthenium film deposited on a ruthenium seed layer with out annealing (FIG. 6B). Heater temperature: 360° C. and wafer temperature: 330° C. FIG. 6A: 288 Å CVD ruthenium film deposited for 100 sec. on annealed CVD ruthenium seed; haze: 89.5 ppm; color: silver; resisitivity: 41 $\mu\Omega$-cm. FIG. 6B: 401 Å CVD ruthenium film deposited for 100 sec. on CVD ruthenium seed without annealing; haze: 75.7 ppm; color: purple ($RuO_2$ film); resisitivity: 89 $\mu\Omega$-cm.

FIG. 7 shows SEM images of the interface between the CVD ruthenium seed layer and the ThOx substrate without annealing (FIG. 7A) and with annealing the ruthenium seed layer to the ThOx substrate prior to CVD ruthenium deposition (FIG. 7B). Heater temperature: 360° C. and wafer temperature: 330° C.

FIG. 8 shows SEM images comparing the smoothness of a CVD ruthenium seed layer with annealing (FIG. 8A) and without annealing (FIG. 8B). Heater temperature: 360° C. and wafer temperature: 330° C.

FIG. 9 shows SEM images comparing the haze of CVD ruthenium films on CVD ruthenium seed layers of differing thicknesses. Heater temperature: 360° C. and wafer temperature: 330° C. A 134 Å CVD ruthenium film layer deposited for 50 seconds on a CVD ruthenium seed layer deposited for 25 seconds has a haze of 83.2 ppm and a resistivity of 53.3 $\mu\Omega$-cm (FIG. 9A). A 140 Å CVD ruthenium film layer deposited for 50 seconds on a CVD ruthenium seed layer deposited for 25 seconds has a haze of 55.2 ppm and a resistivity of 55.3 $\mu\Omega$-cm (FIG. 9B).

DETAILED DESCRIPTION OF THE INVENTION

Figure 1:
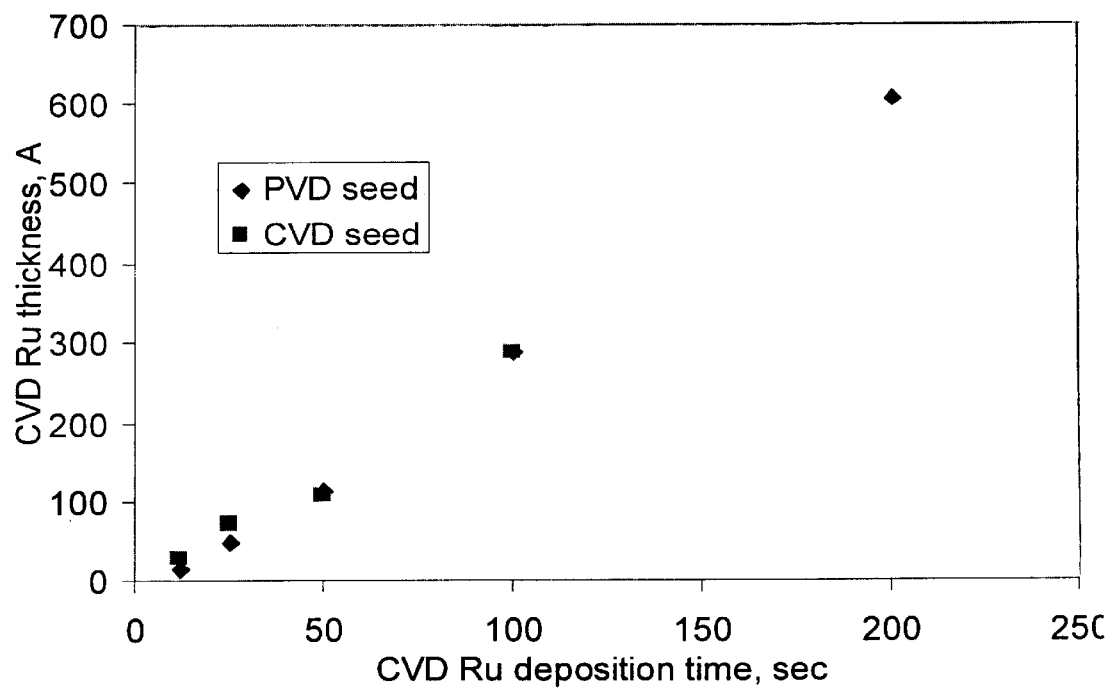
FIG. 1 compares the deposition rate of CVD Ru on a CVD Ru seed layer with the deposition rate of CVD Ru on a PVD Ru seed layer.

In one embodiment, the present invention is directed to a method of forming a ruthenium seed layer on a substrate comprising the steps of vaporizing a ruthenium-containing compound; introducing the vaporized ruthenium-containing compound into a CVD apparatus; introducing oxygen into the CVD apparatus; maintaining an oxygen rich environment in a process chamber of the CVD apparatus for the initial formation of a ruthenium oxide seed layer; depositing the ruthenium oxide seed layer onto the substrate by chemical vapor deposition; and annealing the deposited ruthenium oxide seed layer in a gas ambient forming a ruthenium seed layer. Generally, an oxygen to ruthenium ratio from about 1:1 to 100:1 is used. The ratio may also be 14:1. The ruthenium-containing compound is heated to about 200° C. to about 400° C. Examples of these compounds are ruthenium bis-(ethylcyclopentadienyl) and ruthenium octanedionate. The vapor deposited ruthenium seed layer is annealed in an $H_2/N_2$, $H_2$ or $H_2/Ar$ gas environment at about 200° C. to about 600° C. Hydrogen gas may comprise about 10% to 100% of the ambient. Representative examples of the substrate include silicon, silicon dioxide, titanium nitride, titanium aluminum nitride, tantalum nitride, tantalum pentoxide and barium strontium titanate. One object of this embodiment is to provide a ruthenium seed layer with a structure of RuOx prior to annealing of the seed layer, where x is 2, and RuOx contains about 60% oxygen and after annealing of the seed layer, a ruthenium seed layer with a structure RuOy is formed, where y is less than 2, and contains less than about 20% oxygen. A ruthenium seed film deposited in accordance with this method may have a thickness of about 100 Å or less.

In another embodiment of the present invention, there is provided a method of forming a ruthenium seed layer on a substrate comprising the steps of vaporizing a ruthenium-containing compound at a temperature of about 200° C. to about 400° C.; introducing the vaporized ruthenium-containing compound into a CVD apparatus; introducing oxygen into the CVD apparatus; maintaining an oxygen rich environment in a process chamber of the CVD apparatus for the initial formation of a ruthenium oxide seed layer wherein the oxygen to ruthenium ratio in said environment is from about 1:1 to about 100:1; depositing the ruthenium oxide seed layer onto the substrate by chemical vapor deposition; and annealing the deposited ruthenium oxide seed layer in a gas ambient selected from the group consisting of $H_2/N_2$, $H_2$ and $H_2/Ar$ and wherein said annealing occurs at about 200° C. to about 600° C. thereby forming a ruthenium seed layer. Examples of these ruthenium-containing compounds are ruthenium bis-(ethylcyclopentadienyl) and ruthenium octanedionate. The oxygen to ruthenium ratio may be about 14:1. Hydrogen gas may comprise about 10% to 100% of the ambient. Representative examples of the substrate include silicon, silicon dioxide, titanium nitride, titanium aluminum nitride, tantalum nitride, tantalum pentoxide and barium strontium titanate. Additionally, one object of this embodiment of the present invention provides a ruthenium seed layer with a structure of RuOx where, prior to annealing the seed layer, x is about 2 and RuOx contains from about 60% oxygen and after annealing the seed layer, the ruthenium seed layer has a structure of RuOy, where y is less than 2, and contains less than about 20% oxygen. A ruthenium seed film deposited in accordance with this method may have a thickness of about 100 Å or less.

In yet another embodiment, the present invention is directed to a method of forming a ruthenium seed layer on a substrate comprising the steps of vaporizing a ruthenium-containing compound at a temperature of about 200° C. to about 400° C.; introducing the vaporized ruthenium-containing compound into a CVD apparatus; introducing oxygen into the CVD apparatus; maintaining an oxygen rich environment in a process chamber of the CVD apparatus for the initial formation of a ruthenium oxide seed layer wherein the oxygen to ruthenium ratio in said environment is from about 1:1 to about 100:1; depositing the ruthenium oxide seed layer onto the substrate by chemical vapor deposition such that the ruthenium oxide is RuOx wherein x is about 2; and annealing the deposited ruthenium oxide seed layer in a gas ambient selected from the group consisting of $H_2/N_2$, $H_2$ and $H_2/Ar$; wherein said annealing occurs from about 200° C. to about 600° C. wherein the ruthenium is RuOy with y less than 2 thereby forming a ruthenium seed layer. Examples of these compounds are ruthenium-containing compounds are ruthenium bis-(ethylcyclopentadienyl) and ruthenium octanedionate. The oxygen to ruthenium ratio may b e about 14:1. Hydrogen gas may comprise about 10% to 100% of the ambient. Representative examples of the substrate include silicon, silicon dioxide, titanium nitride, titanium aluminum nitride, tantalum nitride, tantalum pentoxide and barium strontium titanate. A ruthenium seed film deposited in accordance with this method may have a thickness of about 100 Å or less.

In yet another embodiment, the present invention is directed to a method of forming a ruthenium thin metal film using a metalorganic precursor comprising the steps of forming a ruthenium seed layer on a substrate by the method(s) disclosed above; vaporizing the metalorganic precursor; and depositing the ruthenium thin metal film on the ruthenium seed layer b y metalorganic chemical vapor deposition. Representative examples of the metalorganic precursor include ruthenium bis-(ethylcyclopentadienyl) and ruthenium octanedionate.

The following definitions are given for the purpose of facilitating understanding of the inventions disclosed herein. Any terms not specifically defined should be interpreted according to the common meaning of the term in the art.

As used herein the term, "seed layer" shall refer to a layer of material used to facilitate the growth of another layer in order to have desired properties; e.g., high nucleation density, smoothness, better binding to the substrate, and low oxygen content. As used herein, the term "haze" shall refer to a measure of surface roughness by optical light scattering.

CVD ruthenium (Ru) deposition via metalorganic chemical vapor deposition (MOCVD) precursors, e.g., ruthenium bis-(ethylcyclopentadienyl) (Ru (EtCp)$_2$) or ruthenium octanedionate (Ru(OD)$_3$), require a seed layer if the substrate is, among others, silicon (Si), silicon dioxide (SiO$_2$), silicon nitride (SiN), titanium nitride (TiN), titanium aluminum nitride (TaIN), tantalum nitride (TaN), tantalum pentoxide (Ta$_2$O$_5$), or barium strontium titanate (BST). The quality of the CVD ruthenium thin film is dependent on the characteristics of the seed layer. CVD ruthenium thin film deposition requires a smooth seed layer in order to deposit a smooth ruthenium film. Additionally, seed thickness is critical to ensure that the subsequently deposited ruthenium thin film does not peel. By controlling the properties of CVD ruthenium seed, by manipulating e.g., oxygen content, orientation and seed thickness, a CVD ruthenium film, or even a CVD ruthenium dioxide film, with specific film properties such as oxygen content, orientation and smoothness, can be deposited o n the seed layer.

Annealing the CVD seed in an $H_2/N_2$, $H_2$, or $H_2/Ar$ gas environment provides the means to tune the properties of the CVD ruthenium seed layer. Also, $H_2/N_2$, $H_2$, or $H_2/Ar$ annealing can change interface conditions, such as oxygen content, bond and orientation, for higher capacitor density and lower leakage current in the MIM structure capacitor. CVD seed deposition, annealing and CVD ruthenium deposition can be completed in either one chamber or in different chambers during the process.

The following examples are given for the purpose of illustrating various embodiments of the invention and are not meant to limit the present invention in any fashion.

EXAMPLE 1

Oxygen to Ruthenium Ratios, Flow Rates and Process Conditions Used in CVD Seed or Thin Film Deposition Processes A 1M in octane solution of a ruthenium-containing compound is used for either CVD seed or ruthenium thin film deposition. This corresponds to a solution containing approximately 30% ruthenium with the remainder octane as solvent which yields an oxygen to ruthenium ratio of about 50:1. The total liquid flow is one-third ruthenium in octane.

As the ruthenium-containing compound used herein as a precursor is a liquid metalorganic compound, it must be vaporized prior to introduction into the CVD process chamber. Upon vaporization the ruthenium-containing precursor is mixed with pure oxygen to maintain an oxygen rich environment. Ruthenium is generally flowed at a rate of about 100 mg/min and may be flowed as high as about 180 mg/min and oxygen is generally flowed at a rate of about 1000 sccm and may be increased as high as about 5000 sccm. With further concentration or dilution of the ruthenium in octane, oxygen to ruthenium ratios from about 1:1 to about 100:1 can be obtained.

The type of film to be deposited can determine the oxygen:ruthenium ratio used. To deposit a ruthenium oxide film as a CVD seed layer, a ratio of at least 10:1 is used with the upper oxygen limit being several hundred. However, since a CVD deposited ruthenium thin film is a pure ruthenium film and the presence of significant oxygen is precluded, the oxygen flow is significantly reduced to levels yielding a ratio of less than about 10:1 oxygen to ruthenium.

Although any of these disclosed oxygen to ruthenium ratios may be used, CVD deposition of ruthenium seed flow rates of about 2500 sccm O$_2$ to about 180 mg/min. of ruthenium are used to give about a 14:1 ratio and CVD deposition of a ruthenium thin film flow rates of about 300 sccm O2 to about 180 mg/min of ruthenium are used thus yielding about a 1.5:1 ratio. Pure precursor with pure oxygen may also be used; this corresponds to an oxygen to ruthenium ratio of about 150:1.

Additionally, the ruthenium-containing compound may be vaporized in a vaporization chamber prior to introduction into the process chamber or may be vaporized directly in the process chamber, but vaporization is necessary prior to deposition. Although the heater temperature and wafer temperature may vary for these applications from about 200° C. to about 400° C., a heater temperature of 360° C. and a wafer temperature of 330° C. are used herein.

EXAMPLE 2

Figure 2A:
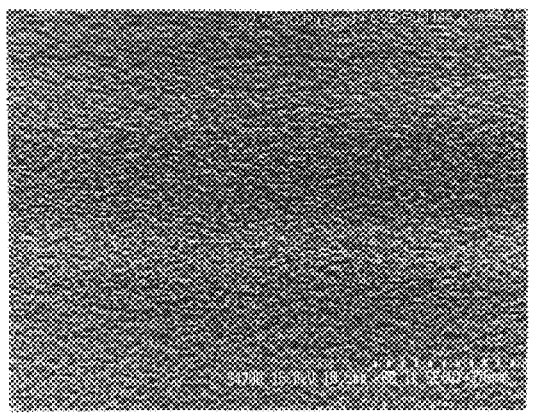
FIG. 2A shows thickness: 289 Å CVD Ru film deposited over 100 sec.; haze: 44.36 ppm.; color: silver; resistivity: ~39 $\mu\Omega$-cm.
Figure 2B:
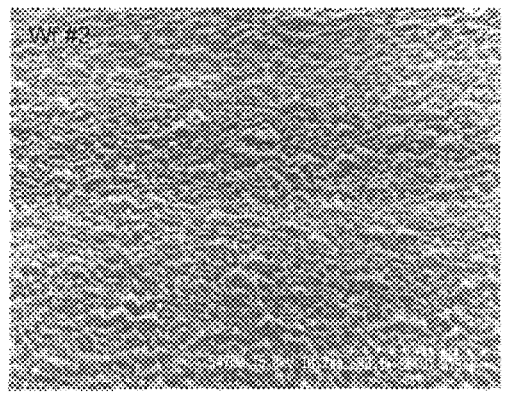
FIG. 2B shows thickness: 288 Å CVD Ru film deposited over 100 sec.; haze: 89.5 ppm.; color: silver; resistivity: 41 $\mu\Omega$-cm.

Comparison of CVD Ruthenium Deposition on a CVD Seed Layer with Deposition on a PVD Seed Layer FIG. 1 shows that the CVD ruthenium deposition rate on a CVD ruthenium seed layer is close to that of CVD deposition on a PVD ruthenium seed layer. With deposition conditions being equal, the thickness of a CVD ruthenium film on PVD ruthenium seed (FIG. 2A) is equal to that on a CVD ruthenium seed layer with annealing (FIG. 2B), 289 Å and 288 Å with 100 seconds deposition time, respectively. However, a comparison of surface morphologies of these films shows a rougher CVD ruthenium film on the CVD seed layer.

PVD deposition inherently yields a smooth layer, thus the CVD deposited ruthenium film upon a PVD ruthenium seed layer is smoother than that upon a CVD ruthenium seed layer. The surface morphology of the CVD seed layer can be smoothed if the oxygen is increased while keeping the ruthenium concentration constant. An oxygen flow rate of 1000 sccm yields a rougher $RuO_2$ seed layer than if the flow rate is increased to 5000 sccm (data not shown). This affects the resultant quality of the deposited ruthenium film upon the seed layer.

Figure 3:
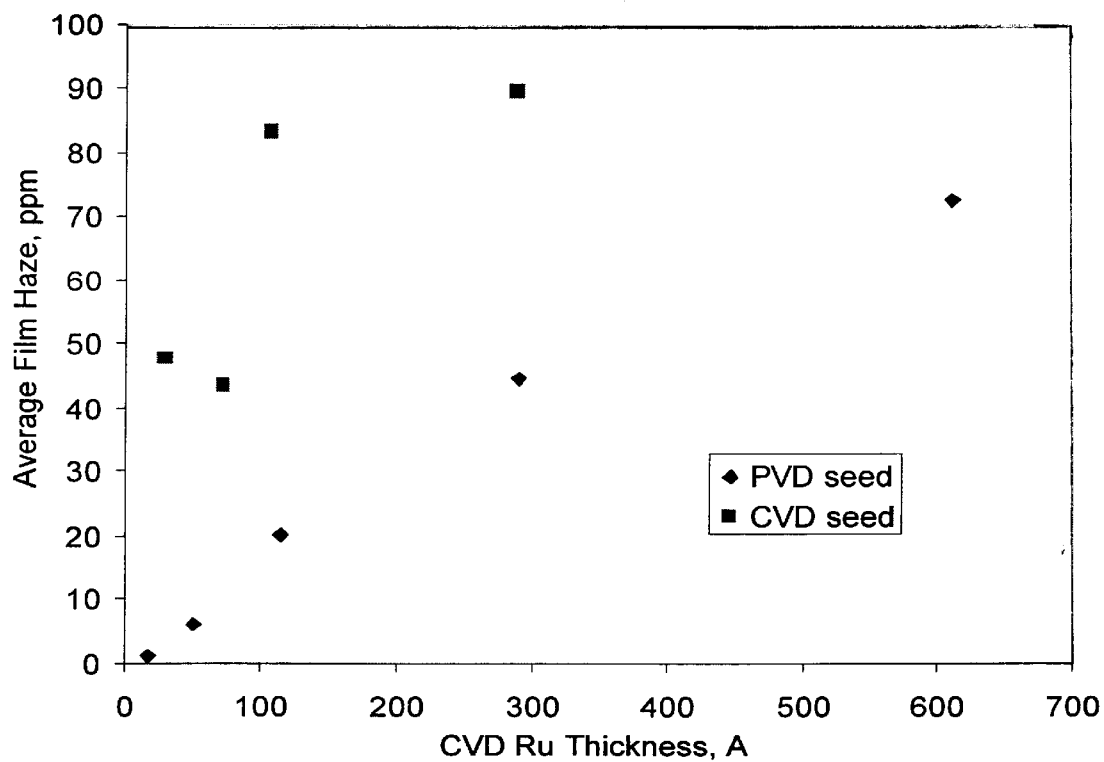
FIG. 3 depicts the change in the average film haze as the thickness of a CVD Ru film increases for a CVD Ru film deposited on a CVD Ru seed layer and a CVD Ru film deposited on a PVD Ru seed layer as the CVD Ru.

Film haze of a CVD ruthenium film on a CVD seed layer is significantly higher than that of a CVD ruthenium film on PVD seed. The average film haze of a ruthenium film on CVD seed increases dramatically as the CVD ruthenium film thickness increases for thicknesses up to about 300 Å (FIG. 3). As demonstrated in FIG. 2B, the haze of the ruthenium film on the CVD seed layer is twice that of the PVD seed layer.

EXAMPLE 3

Comparison of CVD Ruthenium Deposition on a CVD Seed Layer with Deposition on Substrate Alone The quality of CVD ruthenium films is enhanced by the presence of a CVD ruthenium seed layer. A CVD ruthenium film deposited on a thermal oxide (ThOx) substrate without a CVD seed layer requires a longer incubation time and yields a ruthenium film that is not continuous on the substrate and has significant haze.

Figure 4A:
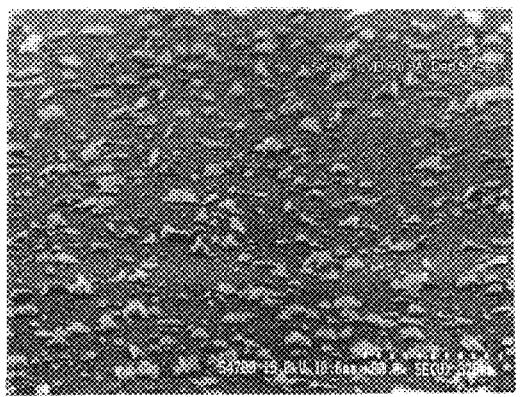
FIG. 4A: Thickness: 8 Å CVD Ru film deposited over 50 sec.; haze: 182.34 ppm.
Figure 4B:
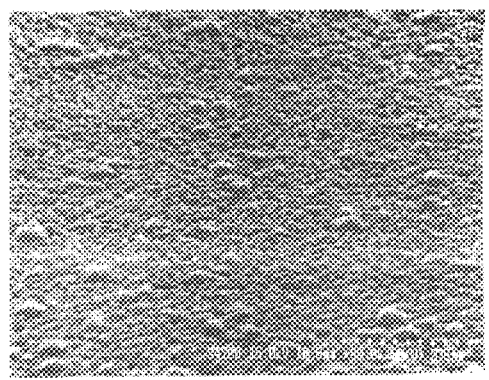
FIG. 4B: CVD of Ru seed on ThOx for 25 sec.; thickness: 134 Å CVD Ru film deposited over 50 sec.; haze: 83.2 ppm and resistivity: 53.3 $\mu\Omega$-cm

FIG. 4A shows that a 50 second deposition time for a CVD ruthenium film results in a film thickness of only 8 Å and a film layer possessing 182.34 ppm haze. In contrast, a 25 second deposition of a CVD ruthenium seed layer prior to the 50 second CVD ruthenium film deposition increases the film thickness to 134 Å layered continuously over the substrate and decreases the haze to 83.2 ppm (FIG. 4B).

Figure 5A:
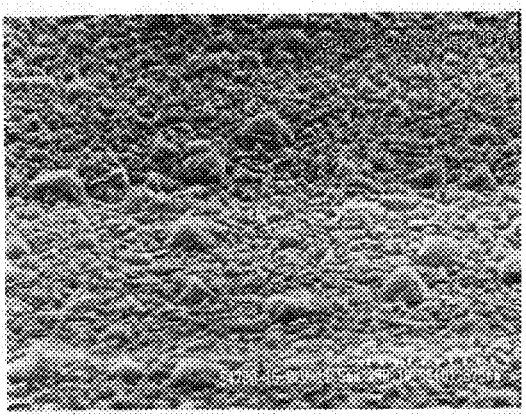
FIG. 5A shows thickness: 310 Å $RuO_2$ film deposited over 100 sec.; haze: 79.6 ppm; color: purple; resistivity; 82 $\mu\Omega$-cm.
Figure 5B:
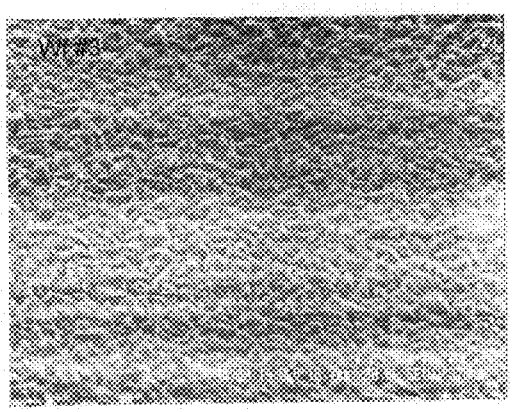
FIG. 5B shows thickness: 401 Å $RuO_2$ film deposited over 100 sec. onto a CVD ruthenium seed layer deposited over 25 sec.; haze: 75.7 ppm; color: purple; resistivity; 89 $\mu\Omega$-cm.

A CVD seed layer allows for a smoother deposited film layer as compared to deposition directly on the substrate. The surface morphology of a CVD ruthenium oxide (RuO) film deposited on the substrate results in a rougher film surface (FIG. 5A) than a corresponding ruthenium oxide film deposited on a CVD seed layer (FIG. 5B). The presence of the CVD seed layer also enhances the thickness of the film layer as the incubation time is not as long. However, other film characteristics, e.g., haze, film color and resistivity of the ruthenium oxide films deposited on substrate and on CVD seed are similar.

EXAMPLE 4

Annealing the CVD Ruthenium Seed Layer

CVD deposition of a significantly pure ruthenium film requires prior deposition of a CVD ruthenium seed layer. CVD ruthenium deposition on a ruthenium dioxide ($RuO_2$) seed layer results in a $RuO_2$ film. It is ineffective to attempt to seed with ruthenium in a low oxygen environment. Raising the oxygen flow rate, however, allows for effective seeding of a $RuOx$ seed layer (x is about 2).

The oxygen ratio is critical; oxygen decomposes the vaporized metalorganic ruthenium-containing compound to release ruthenium for deposition onto the substrate and removes the subsequently released carbon, thus insuring a low carbon content in the seed layer. Yet, not all the oxygen in the system is consumed which therefore results in a ruthenium oxide seed layer. CVD seed deposited in an oxygen rich environment where the $O_2/Ru$ ratio is about 1:1 to about 100:1 when a ruthenium containing precursor diluted in octane is used yields a film with a high oxygen content; the oxygen enhances the nucleation on the substrate. Increasing the $O_2/Ru$ ratio improves the surface smoothness of the seed layer. However, as the oxygen ratio is increased, the concentration of the ruthenium-containing compound is concomitantly reduced. This may reduce the amount of ruthenium available for oxidation and increase the oxygen content of the seed layer.

CVD seed needs to be annealed in an $H_2/N_2$, $H_2$, or $H_2/Ar$ gas ambient at about 200° C.–600° C. The hydrogen gas in this ambient may comprise from about 10% to 100% of the ambient. This reduces the oxygen content in the RuOx seed layer and increases the content of ruthenium in the seed thus yielding a $RuOy$ compound where y in the annealed layer is much less than x, i.e., y is less than 2, in the originally deposited layer. This means that annealing the seed layer reduces the oxygen content from about 60% for RuOx to less than about 20% for the annealed RuOy. Consequently, the ruthenium seeding is even and, subsequently, a significantly pure ruthenium thin film can b e deposited effectively.

FIGS. 6A and 6B compare the film characteristics of a CVD ruthenium film deposited on an annealed CVD seed layer with that deposited on a CVD seed layer without annealing. The deposited film on the unannealed seed layer exhibits characteristics of a $RuO_2$ film; purple film color and a resistivity of 89 $\mu\Omega$-cm. Annealing the seed layer converts the $RuO_2$ in the seed layer to a seed layer comprising ruthenium having a much lower oxygen content (from about 60% prior to annealing to about 20% post annealing), thereby allowing for the subsequent deposition of a ruthenium film. The silver film color and resistivity of 41 $\mu\Omega$-cm of the film shown in FIG. 6A indicate that a significantly pure ruthenium film has been deposited on the annealed seed layer.

Figure 7A:
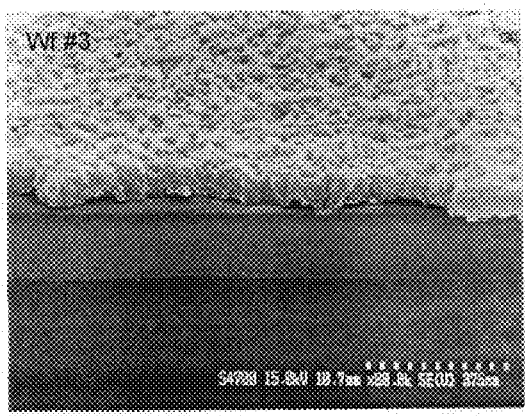
FIG. 7A: CVD seed and CVD ruthenium film only; color: silver; adherence: film did not adhere on substrate
Figure 7B:
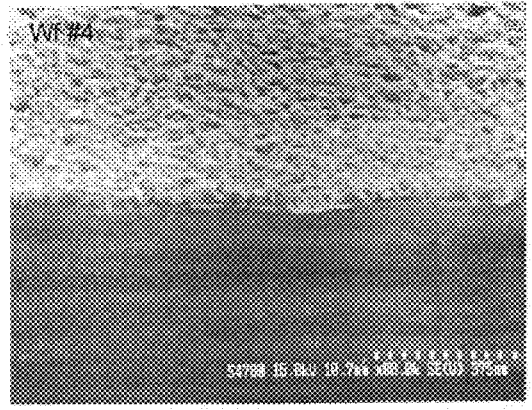
FIG. 7B: CVD seed with annealing and CVD ruthenium film; color: purple ($RuO_2$ film); adherence: film adheres on substrate.
Figure 8A:
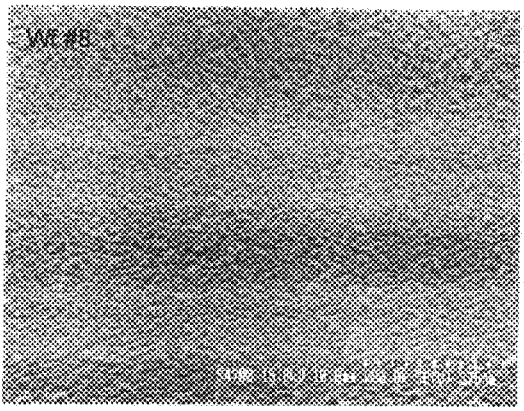
FIG. 8A: 27 Å CVD ruthenium seed film deposited for 25 sec. with anneal; haze: 29.3 ppm; surface: smooth film.
Figure 8B:
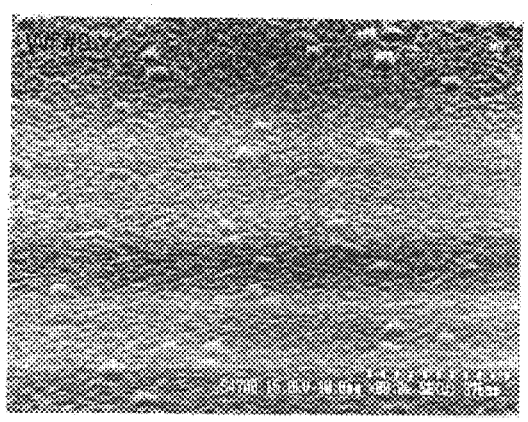
FIG. 8B: 19 Å CVD ruthenium seed film deposited for 25 sec. without anneal; haze: 38.2 ppm; surface: bumpy film.

Annealing the CVD seed layer also increases adhesion of the seed film to the substrate. On a ThOx substrate, a deposited seed layer; i.e., one with a high oxygen content, adheres poorly at the interface (FIG. 7A). Annealing converts the film to a ruthenium film as indicated by the silver film color and the film adheres to the substrate at the interface (FIG. 7B). Additionally, annealing enhances the homogeniety of the surface of the film thereby smoothing it. In FIG. 8A, the rough or bumpy film surface of the unannealed seed is apparent. Annealing the seed film results in a more uniform, smoother film surface (FIG. 8B).

EXAMPLE 5

Seed Thickness of CVD Ruthenium Seed Layer

The thickness of the CVD ruthenium seed layer is critical for effective subsequent CVD ruthenium thin films. Seed thickness is controlled by deposition time. A shorter seed deposition time reduces haze on the thin films. The haze of a thin ruthenium film deposited on CVD seed with a 25 second seed deposition time (FIG. 9A) is approximately 30% greater than that of a thin film on a CVD seed layer where the deposition time is only 18 seconds (FIG. 9B). Additionally, a thick seed layer will cause a subsequently deposited ruthenium thin film, one that has a deposition time of 50 seconds, to peel from the seed layer. CVD ruthenium seed layers of about 100 Å thickness provide for less haze on the subsequently deposited ruthenium thin film.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of forming a ruthenium seed layer on a substrate comprising the steps of:
    (a) vaporizing a ruthenium-containing compound;
    (b) introducing the vaporized ruthenium-containing compound into a CVD apparatus;
    (c) introducing oxygen into the CVD apparatus to form an oxygen rich environment; wherein said oxygen is introduced at a flow rate of about 1000 sccm to about 5000 sccm;
    (d) maintaining the oxygen rich environment in a process chamber of the CVD apparatus;
    (e) depositing a ruthenium oxide layer onto the substrate by chemical vapor deposition; and
    (f) annealing the deposited ruthenium oxide layer in a gas ambient to remove oxygen from said ruthenium oxide layer thus forming the ruthenium seed layer.

2. The method of claim 1, wherein the substrate is selected from the group consisting of silicon, silicon dioxide, titanium nitride, titanium aluminum nitride, tantalum nitride, tantalum pentoxide and barium strontium titanate.

3. The method of claim 1, wherein said ruthenium-containing compound is selected from the group consisting of ruthenium bis-(ethylcyclopentadienyl) and ruthenium octanedionate.

4. The method of claim 1, wherein the oxygen to ruthenium ratio in said oxygen rich environment is from about 1:1 to about 100:1.

5. The method of claim 4, wherein the oxygen to ruthenium ratio in said oxygen rich environment is about 14:1.

6. The method of claim 1, wherein vaporization occurs at a temperature from about 200° C. to about 400° C.

7. The method of claim 1, wherein prior to annealing, the ruthenium oxide layer is RuOx wherein x is 2.

8. The method of claim 7, wherein the percentage of oxygen in the RuOx compound is about 60%.

9. The method of claim 1, wherein said annealing occurs in a gas ambient selected from the group consisting of $H_2/N_2$, $H_2$ and $H_2/Ar$.

10. The method of claim 9, wherein the percentage of hydrogen gas in the ambient is from about 10% to 100%.

11. The method of claim 1, wherein said annealing occurs at a temperature from about 200° C. to about 600° C.

12. The method of claim 1, wherein the annealed ruthenium seed layer comprises $RuO_y$ wherein y is less than 2.

13. The method of claim 12, wherein the percentage of oxygen in $RuO_y$ is less than about 20%.

14. The method of claim 12, wherein the ruthenium seed layer has a thickness of about 100 Å or less.

15. The method of claim 1, wherein the ruthenium seed layer is used for the subsequent metalorganic chemical vapor deposition of a ruthenium film thereon.

16. The method of claim 15, wherein said ruthenium film is deposited via a metalorganic precursor selected from the group consisting of ruthenium bis-(ethylcyclopentadienyl) and ruthenium octanedionate.

17. A method of forming a ruthenium film using a metalorganic precursor comprising the steps of:
    forming a ruthenium seed layer on a substrate by the method of claim 1;
    vaporizing the metalorganic precursor; and
    depositing the ruthenium film on the ruthenium seed layer by metalorganic chemical vapor deposition.

18. The method of claim 17, wherein said metalorganic precursor is selected from the group consisting of ruthenium bis-(ethylcyclopentadienyl) and ruthenium octanedionate.

19. A method of forming a ruthenium seed layer on a substrate comprising the steps of:
    (a) vaporizing a ruthenium-containing compound at a temperature of about 200° C. to about 400° C.;
    (b) introducing the vaporized ruthenium-containing compound into a CVD apparatus;
    (c) introducing oxygen into the CVD apparatus to form an oxygen rich environment; wherein said oxygen is introduced at a flow rate of about 1000 sccm to about 5000 sccm;
    (d) maintaining the oxygen rich environment in a process chamber of the CVD apparatus wherein the oxygen to ruthenium ratio in said environment is from about 1:1 to about 100:1;
    (e) depositing a ruthenium oxide layer onto the substrate by chemical vapor deposition; and
    (f) annealing the deposited ruthenium oxide layer in a gas ambient selected from the group consisting of $H_2/N_2$, $H_2$ and $H_2/Ar$; said annealing occurring at a temperature from about 200° C. to about 600° C.; wherein said annealing removes oxygen from said ruthenium oxide layer thereby forming the ruthenium seed layer.

20. The method of claim 19, wherein the oxygen to ruthenium ratio in said oxygen rich environment is about 14:1.

21. The method of claim 19, wherein prior to annealing, the ruthenium oxide layer is $RuO_x$ wherein x is 2.

22. The method of claim 21, wherein the percentage of oxygen in $RuO_x$ is about 60%.

23. The method of claim 19, wherein the percentage of hydrogen gas in the ambient is from about 10% to 100%.

24. The method of claim 19, wherein the annealed ruthenium seed layer is $RuO_y$ wherein y is less than 2.

25. The method of claim 24, wherein the percentage of oxygen in $RuO_y$ is less than about 20%.

26. The method of claim 24, wherein the ruthenium seed layer has a thickness of about 100 Å or less.

27. The method of claim 19, wherein the ruthenium seed layer is used for the subsequent metalorganic chemical vapor deposition of a ruthenium film thereon.

28. The method of claim 27, wherein said ruthenium film is deposited via a metalorganic precursor selected from the group consisting of ruthenium bis-(ethylcyclopentadienyl) and ruthenium octanedionate.

29. The method of claim 19, wherein the substrate is selected from the group consisting of silicon, silicon dioxide, titanium nitride, titanium aluminum nitride, tantalum nitride, tantalum pentoxide and barium strontium titanate.

30. The method of claim 17, wherein said ruthenium-containing compound is selected from the group consisting of ruthenium bis-(ethylcyclopentadienyl) and ruthenium octanedionate.

31. A method of forming a ruthenium seed layer on a substrate comprising the steps of:
 (a) vaporizing a ruthenium-containing compound at a temperature of about 200° C. to about 400° C.;
 (b) introducing the vaporized ruthenium-containing compound into a CVD apparatus;
 (c) introducing oxygen into the CVD apparatus to form an oxygen- rich environment; wherein said oxygen is introduced at a flow rate of about 1000 sccm to about 5000 sccm;
 (d) maintaining the oxygen rich environment in a process chamber of the CVD apparatus wherein the oxygen to ruthenium ratio in said environment is from about 1:1 to about 100:1;
 (e) depositing a ruthenium oxide layer onto the substrate by chemical vapor deposition such that the ruthenium oxide is RuOx wherein x is about 2; and
 (f) annealing the deposited ruthenium oxide layer in a gas ambient selected from the group consisting of $H_2/N_2$, $H_2$ and $H_2/Ar$; said annealing occurring at a temperature from about 200° C. to about 600° C.; wherein said annealing removes oxygen from said ruthenium oxide layer such that the ruthenium is RuOy with y less than 2 thereby forming the ruthenium seed layer.

32. The method of claim 31, wherein the percentage of oxygen in RuOx is about 60%.

33. The method of claim 31, wherein the percentage of oxygen in RuOy is less than about 20%.

34. The method of claim 31, wherein the ruthenium seed layer has a thickness of about 100 Å or less.

35. The method of claim 31, wherein the ruthenium seed layer is used for the subsequent metalorganic chemical vapor deposition of a ruthenium film thereon.

36. The method of claim 35, wherein the ruthenium film is deposited via a metalorganic precursor selected from the group consisting of ruthenium bis-(ethylcyclopentadienyl) and ruthenium octanedionate.

37. The method of claim 31, wherein the substrate is selected from the group consisting of silicon, silicon dioxide, titanium nitride, titanium aluminum nitride, tantalum nitride, tantalum pentoxide and barium strontium titanate.

38. The method of claim 31, wherein said ruthenium-containing compound is selected from the group consisting of ruthenium bis-(ethylcyclopentadienyl) and ruthenium octanedionate.

39. A method of forming a ruthenium seed layer on a substrate comprising the steps of:
 (a) vaporizing a ruthenium-containing compound;
 (b) introducing the vaporized ruthenium-containing compound into a CVD apparatus;
 (c) introducing oxygen into the CVD apparatus to form an oxygen rich environment; wherein said oxygen is introduced at a flow rate such that an oxygen to ruthenium ratio in the oxygen rich environment is from about 1:1 to about 100:1;
 (d) maintaining the oxygen rich environment in a process chamber of the CVD apparatus;
 (e) depositing a ruthenium oxide layer onto the substrate by chemical vapor deposition; and
 (f) annealing the deposited ruthenium oxide layer in a gas ambient to remove oxygen from said ruthenium oxide layer thus forming the ruthenium seed layer.

40. The method of claim 39, wherein the substrate is selected from the group consisting of silicon, silicon dioxide, titanium nitride, titanium aluminum nitride, tantalum nitride, tantalum pentoxide and barium strontium titanate.

41. The method of claim 39, wherein said ruthenium-containing compound is selected from the group consisting of ruthenium bis-(ethylcyclopentadienyl) and ruthenium octanedionate.

42. The method of claim 39, wherein said oxygen to ruthenium ratio in the oxygen rich environment is about 14:1.

43. The method of claim 39, wherein vaporization occurs at a temperature from about 200° C. to about 400° C.

44. The method of claim 39, wherein prior to annealing, the ruthenium oxide layer is RuOx wherein x is 2.

45. The method of claim 44, wherein the percentage of oxygen in the RuOx compound is about 60%.

46. The method of claim 39, wherein said annealing occurs in a gas ambient selected from the group consisting of $H_2/N_2$, $H_2$ and $H_2/Ar$.

47. The method of claim 46, wherein the percentage of hydrogen gas in the ambient is from about 10% to 100%.

48. The method of claim 39, wherein said annealing occurs at a temperature from about 200° C. to about 600° C.

49. The method of claim 39, wherein the annealed ruthenium seed layer comprises RuOy wherein y is less than 2.

50. The method of claim 49, wherein the percentage of oxygen in RuOy is less than about 20%.

51. The method of claim 49, wherein the ruthenium seed layer has a thickness of about 100 Å or less.

52. The method of claim 39, wherein the ruthenium seed layer is used for the subsequent metalorganic chemical vapor deposition of a ruthenium film thereon.

53. The method of claim 52, wherein said ruthenium film is deposited via a metalorganic precursor selected from the group consisting of ruthenium bis-(cthylcyclopentadienyl) and ruthenium octanedionate.

* * * * *